US009922604B2

(12) United States Patent
He et al.

(10) Patent No.: US 9,922,604 B2
(45) Date of Patent: Mar. 20, 2018

(54) DISPLAY PANEL, DISPLAY DEVICE AND DISPLAY METHOD

(71) Applicants:Xiamen Tianma Micro-Electronics Co., Ltd., Xiamen (CN); Tianma Micro-Electronics Co., Ltd., Shenzhen (CN)

(72) Inventors: Chunyan He, Xiamen (CN); Zhaodong Zhang, Xiamen (CN); Taichi Chen, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/092,594

(22) Filed: Apr. 6, 2016

(65) Prior Publication Data

US 2017/0061907 A1    Mar. 2, 2017

(30) Foreign Application Priority Data

Aug. 28, 2015 (CN) .......................... 2015 1 0541758

(51) Int. Cl.
*G09G 5/02* (2006.01)
*G09G 3/36* (2006.01)
(Continued)

(52) U.S. Cl.
CPC ..... *G09G 3/3607* (2013.01); *G02F 1/134309* (2013.01); *G09G 3/3208* (2013.01);
(Continued)

(58) Field of Classification Search
CPC .......... G09G 3/3607; G09G 2300/0452; G02F 2201/52; H01L 27/14621; H01L 27/326
(Continued)

(56) References Cited

U.S. PATENT DOCUMENTS

2013/0027437 A1*   1/2013  Gu ..................... G09G 3/3607
                                                              345/690
2014/0300626 A1*  10/2014  Gu ..................... G09G 3/3607
                                                              345/600
(Continued)

FOREIGN PATENT DOCUMENTS

CN            1722193 A       1/2006
CN          102903318 A       1/2013
(Continued)

*Primary Examiner* — Yuzhen Shen
(74) *Attorney, Agent, or Firm* — Kilpatrick Townsend & Stockton LLP

(57) ABSTRACT

Provided is a display panel, a display device and a display method. The display panel can include a plurality of sub pixel columns including sub pixel columns arranged sequentially in a first direction, and the sub pixel columns can be formed by a plurality of sub pixels of the same color arranged sequentially. At least one sub pixel column is in a zigzag line formed by repeat units that repeat in a second direction. Each of the repeat units can include a first segment to a sixth segment that are connected successively. The first, third and fifth segments can be parallel to a diagonal direction of the sub pixel, and the second, fourth and sixth segments can be parallel to the other diagonal direction of the sub pixel. A better display effect can be provided.

4 Claims, 12 Drawing Sheets

(51) Int. Cl.
*G09G 3/3208* (2016.01)
*H01L 27/32* (2006.01)
*G02F 1/1343* (2006.01)

(52) U.S. Cl.
CPC ............ H01L 27/3218 (2013.01); *G02F 2001/134345* (2013.01); *G09G 2300/0452* (2013.01); *G09G 2320/028* (2013.01); *G09G 2320/0233* (2013.01); *G09G 2320/0646* (2013.01)

(58) Field of Classification Search
USPC .................................................. 345/694, 173
See application file for complete search history.

(56) References Cited

U.S. PATENT DOCUMENTS

| 2015/0294628 A1* | 10/2015 | Nakagawa | G09G 3/3607 345/694 |
| 2016/0035266 A1* | 2/2016 | Li | G09G 3/2003 345/205 |
| 2017/0039918 A1* | 2/2017 | Tsao | G09G 3/2003 |

FOREIGN PATENT DOCUMENTS

| CN | 104599599 A | 5/2015 |
| CN | 105321481 A | 2/2016 |
| WO | 2014077179 A1 | 5/2014 |

* cited by examiner

DISPLAY PANEL, DISPLAY DEVICE AND DISPLAY METHOD

CROSS-REFERENCE TO RELATED APPLICATIONS

This application is based upon and claims priority to Chinese Patent Application 201510541758.0, filed on Aug. 28, 2015, the entire contents of which are incorporated here by reference.

TECHNICAL FIELD

The present disclosure relates to the technical field of display technology, and more particularly, to a display panel, a display device and a display method.

BACKGROUND

With the development of optical technology and semiconductor technology, flat display panels such as liquid crystal display (LCD) panels and organic light emitting diode (OLED) display panels have been widely applied in various electronic products for their characteristics of having a slimmer shape, a lower cost and power consumption, a faster response speed, better color purity and brightness, a higher contrast ratio, and the like.

FIG. 1 is a schematic diagram of a pixel matrix in a standard RGB display panel in the prior art. Here, each sub pixel has an aspect ratio of 3:1. Adjacent red sub pixel, green sub pixel and blue sub pixel in the same row collectively constitute a display unit to display various colors.

A requirement on the resolution of the display panel has become higher and higher to improve visual effects. This requires a continuously increasing of the number of sub pixels in the same area. That is, the size of the sub pixel becomes smaller and smaller. However, the size of the sub pixel cannot reduce infinitely due to limitations of processing technology. In order to improve the display effect with a certain pixel size, a display panel having a Delta (triangle) arrangement is provided.

FIG. 2 is a schematic diagram of a pixel matrix of a display panel having a Delta arrangement in the prior art. Here, the lateral dimension of each sub pixel is increased 1.5 times larger than the initial dimension, and each of the numbers of red sub pixels, green sub pixels and blue sub pixels are reduced by ⅓. By sharing sub pixels in lateral direction and combining with particular sub pixel rendering (SPR) algorithms, a PPI (pixels per inch) substantially the same with a standard RGB display panel may be visually realized.

Due to the special arrangement of the sub pixels in the display panel with a Delta arrangement, diagonal stripes as illustrated in FIG. 3 may occur while displaying an image, which is disadvantageous to providing a better display effect.

SUMMARY

The present disclosure is directed to providing a display panel, a display device and a display panel, so as to overcome, at least to some extent, one or more problems due to the restrictions and defects in the related art.

Other properties and advantages of the present disclosure will become more apparent from the flowing detailed description, or in part, may be learned from the practice of the present disclosure.

According to a first aspect of the present disclosure, provided is a display panel including a sub pixel array formed by arrangement of sub pixels of various colors, the sub pixel array including a plurality of sub pixel columns arranged sequentially in a first direction, and each of the sub pixel columns being formed by a plurality of sub pixels of the same color arranged sequentially, where:

at least one of the sub pixel columns is in a zigzag line, and the zigzag line is formed by repeat units that repeat in a second direction, where each of the repeat units includes a first segment to a sixth segment that are connected successively, where:

the first segment to the sixth segment are respectively formed by connecting center points of a pixel column from n-th sub pixel to the (n+a)-th sub pixel, a pixel column from the (n+a)-th sub pixel to the (n+a+b)-th pixel sub pixel, a pixel column from the (n+a+b)-th pixel sub pixel to the (n+a+2b)-th pixel sub pixel, a pixel column from the (n+a+2b)-th pixel sub pixel to the (n+2a+2b)-th pixel sub pixel, a pixel column from the (n+2a+2b)-th pixel sub pixel to the (n+2a+3b)-th pixel sub pixel, and a pixel column from the (n+2a+3b)-th pixel sub pixel to the (n+2a+4b)-th pixel sub pixel, the first, third and fifth segments are parallel to a diagonal direction of the sub pixel, and the second, fourth and sixth segments are parallel to the other diagonal direction of the sub pixel, and where the first direction is vertical to the second direction, and n, a and b are natural numbers.

According to a second aspect of the present disclosure, provided is a display device including:

a display panel as described as above; and a sub pixel rendering module configured to convert a brightness value of each of the virtual sub pixels in a virtual pixel array corresponding to an image to be displayed into a brightness value of each of the sub pixels in the display panel, according to a sub pixel rendering algorithm.

According to a third aspect of the present disclosure, provided is a display method applied in a display panel. The display panel includes a sub pixel array formed by arrangement of sub pixels of various colors. The sub pixel array includes a plurality of sub pixel columns arranged sequentially in a first direction, and each of the sub pixel columns is formed by a plurality of sub pixels of the same color arranged sequentially. At least one of the sub pixel columns is in a zigzag line, which is formed by repeat units that repeat in a second direction. Each of the repeat units includes six segments from a first segment to a sixth segment that are connected successively. The first segment to the sixth segment are respectively formed by connecting center points of a pixel column from n-th sub pixel to the (n+a)-th sub pixel, a pixel column from the (n+a)-th sub pixel to the (n+a+b)-th pixel sub pixel, a pixel column from the (n+a+b)-th pixel sub pixel to the (n+a+2b)-th pixel sub pixel, a pixel column from the (n+a+2b)-th pixel sub pixel to the (n+2a+2b)-th pixel sub pixel, a pixel column from the (n+2a+2b)-th pixel sub pixel to the (n+2a+3b)-th pixel sub pixel, and a pixel column from the (n+2a+3b)-th pixel sub pixel to the (n+2a+4b)-th pixel sub pixel. The first, third and fifth segments are parallel to a diagonal direction of the sub pixel, and the second, fourth and sixth segments are parallel to the other diagonal direction of the sub pixel, and where the first direction is vertical to the second direction, and n, a and b are natural numbers. The display method includes converting a brightness value of each of the virtual sub pixels in a virtual pixel array corresponding to an image to be displayed into a brightness value of each of the sub pixels in the display panel, according to a sub pixel rendering algorithm.

BRIEF DESCRIPTION OF THE DRAWINGS

The above and other features and advantages of the present disclosure will become more apparent by describing its exemplary embodiments in detail with reference to the drawings.

DETAILED DESCRIPTION

Figure 1:
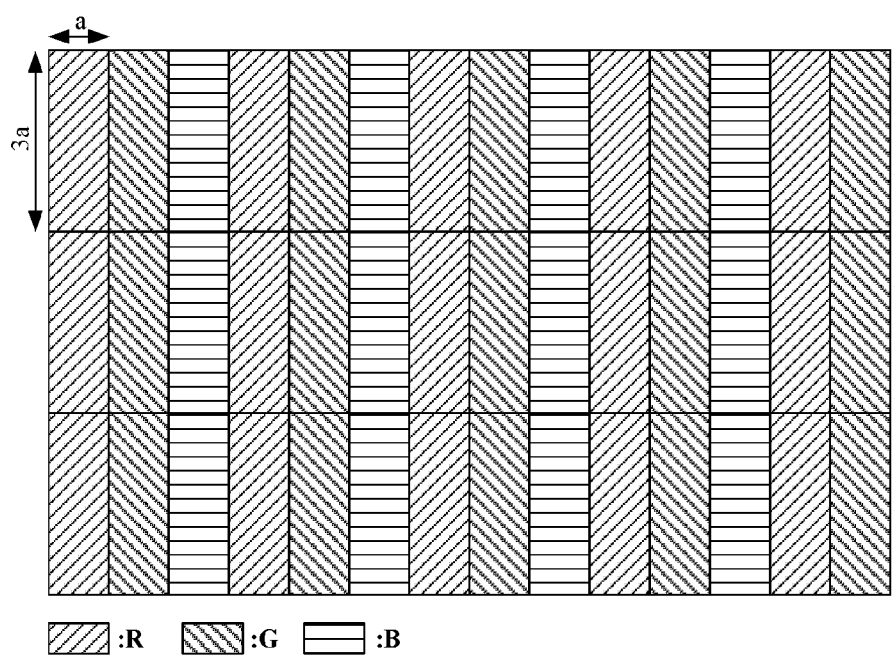
FIG. 1 is a schematic diagram of a pixel matrix in a standard RGB display panel in the prior art.
Figure 2:
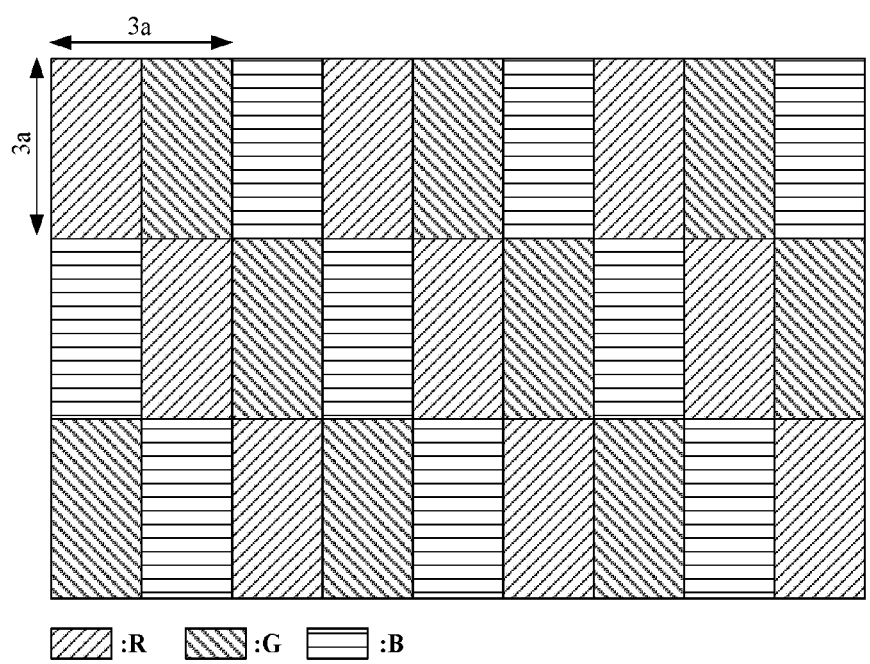
FIG. 2 is a schematic diagram of a pixel matrix in a display panel with Delta arrangement in the prior art.
Figure 3:
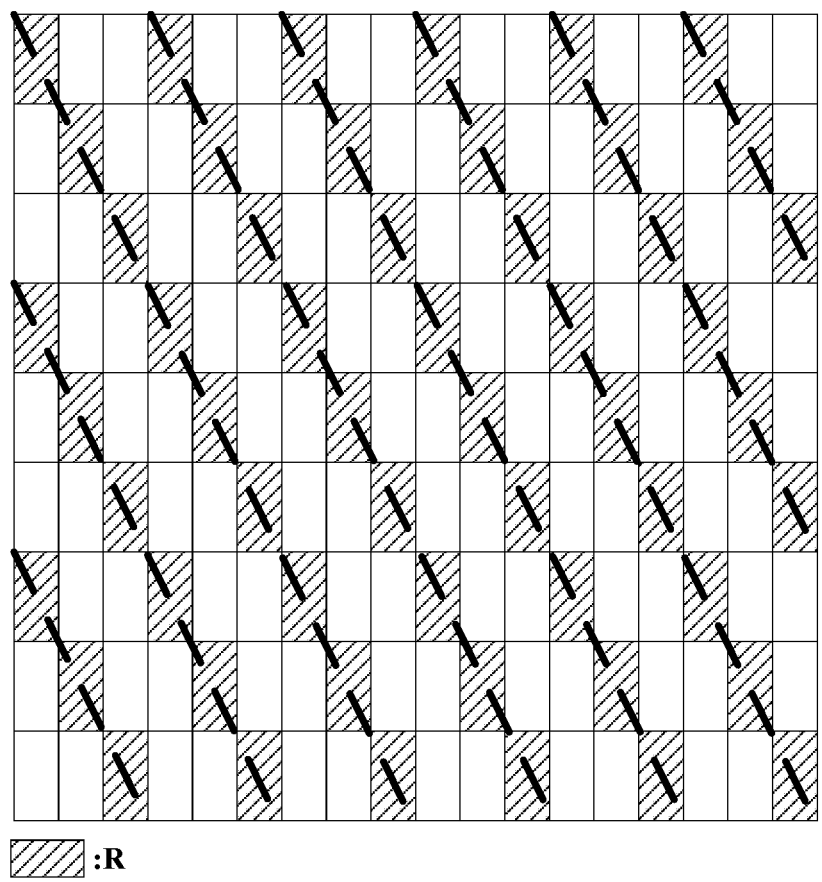
FIG. 3 is a schematic diagram of diagonal stripes occurred in the display panel of FIG. 2 while displaying.

Exemplary embodiments will now be described more fully with reference to the drawings. The exemplary embodiments, however, may be implemented in various forms, and should not be construed as been limited to the implementations set forth here; instead, the implementations are provided such that the present disclosure will be through and complete, and will fully convey the concept of exemplary embodiments to those skilled in the art. In the drawings, shapes and sizes are exaggerated, deformed or simplified for clarity. In the drawings, like reference symbols indicate similar or same structures, and thus their detailed description will be omitted.

In addition, the described features, structures or steps may be combined in one or more embodiments in any suitable ways. In the following description, many detailed details are provided to provide a full understanding of the embodiments of the present disclosure. However, those skilled in the art would realize that the embodiments of the present disclosure may be implemented without one or more of the detailed details, or other methods, steps, structures, and the like may be applied.

First, some exemplary embodiments can provide a display panel, and the display panel may be a liquid crystal display panel or an OLED display panel. In other exemplary embodiments, the display panel may be other type of flat display panel such as a PLED (Polymer Light-Emitting Diode) display panel, a PDP (Plasma Display Panel) display panel. That is, in the this embodiment, the applicable range is not particularly limited.

Figure 4A:
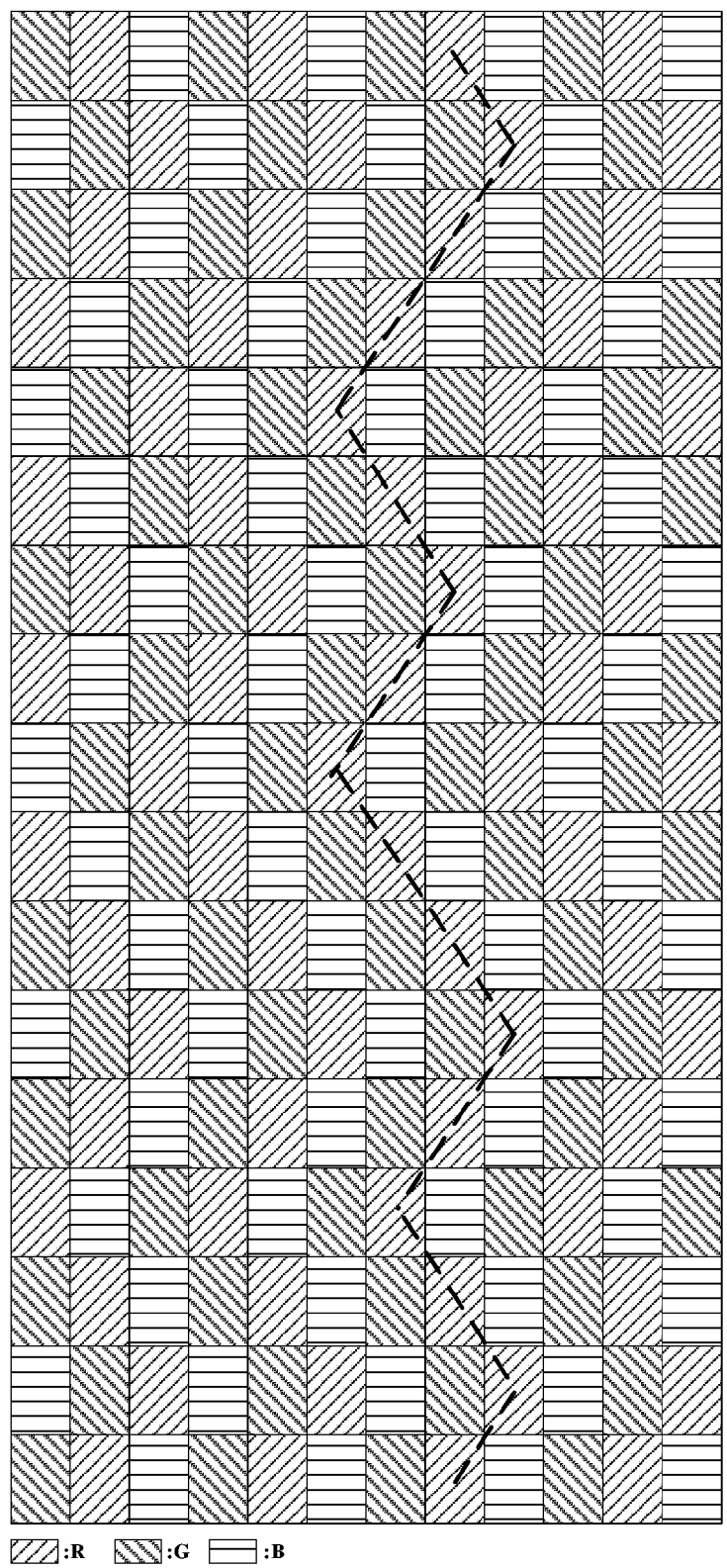
FIGS. 4A-4D are structural schematic diagrams of a pixel matrix according to an exemplary embodiment of the present disclosure, respectively.
Figure 5:
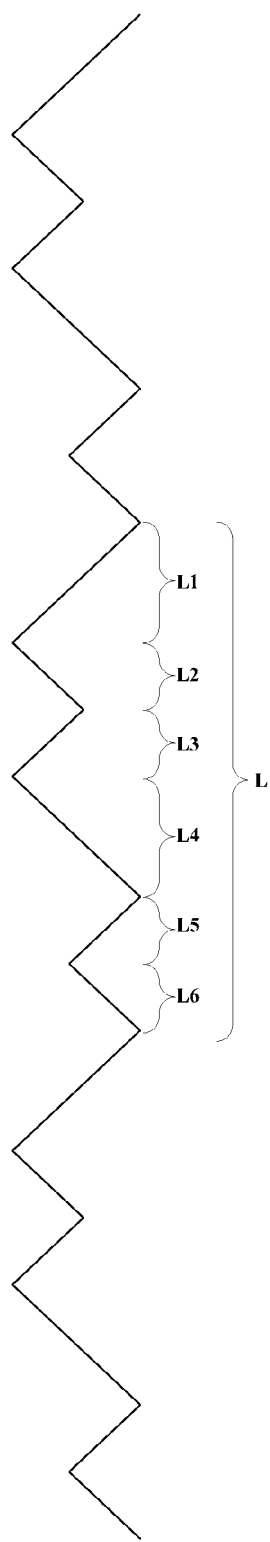
FIG. 5 is a structural schematic diagram of a zigzag line according to an exemplary embodiment of the present disclosure.

Referring to FIG. 4A, a display panel in the this embodiment includes a sub pixel array formed by arrangement of sub pixels of various colors. The sub pixel array includes a plurality of sub pixel columns arranged sequentially in the first direction, and each of the sub pixel columns is formed by a plurality of sub pixels of the same color arranged sequentially. Here, at least one sub pixel column is in a zigzag line as illustrated in FIG. 5, and the zigzag line is formed by repeat units L that repeat in a second direction, e.g., the longitudinal direction. Each of the repeat units L includes six segments from a first segment L1 to a sixth segment L6 that are connected successively. Here, the first segment L1 is formed by connecting center points of the n-th sub pixel to the (n+a)-th sub pixel in the sub pixel column. For example, the first segment L1 may be formed by connecting the center points of the second sub pixel to the fifth (i.e., 2+3) sub pixel in a red sub pixel column in FIG. 5. The second segment L2 is formed by connecting the center points of the (n+a)-th sub pixel to the (n+a+b)-th pixel sub pixel in the sub pixel column. For example, the second segment L2 may be formed by connecting the center points of the fifth sub pixel to the seventh (i.e., 2+5+2) sub pixel in the above red sub pixel column. The third segment L3 is formed by connecting the center points of the (n+a+b)-th pixel sub pixel to the (n+a+2b)-th pixel sub pixel in the sub pixel column. For example, the third segment L3 may be formed by connecting the center points of the seventh sub pixel to the ninth (i.e., 2+3+2×2) sub pixel in the above red sub pixel column. The fourth segment L4 is formed by connecting the center points of the (n+a+2b)-th pixel sub pixel to the (n+2a+2b)-th pixel sub pixel in the sub pixel column. For example, the fourth segment L4 may be formed by connecting the center points of the ninth sub pixel to the twelfth (i.e., 2+2×3+2×2) sub pixel in the above red sub pixel column. The fifth segment L5 is formed by connecting the center points of the (n+2a+2b)-th pixel sub pixel to the (n+2a+3b)-th pixel sub pixel in the sub pixel column. For example, the fifth segment L5 may be formed by connecting the center points of the twelfth sub pixel to the fourteenth (i.e., 2+2×3+3×2) sub pixel in the above red sub pixel column. The sixth segment L6 is formed by connecting the center points of the (n+2a+3b)-th pixel sub pixel to the (n+2a+4b)-th pixel sub pixel in the sub pixel column. For example, the sixth segment L6 may be formed by connecting the center points of the fourteen sub pixel to the sixteen (i.e., 2+2×3+4×2) sub pixel in the above red sub pixel column. The first segment L1, the third segment L3 and the fifth segment L5 are parallel to a diagonal direction of the sub pixel, and the second segment L2, the fourth segment L4 and the sixth segment L6 are parallel to the other diagonal direction of the sub pixel.

Figure 4B:
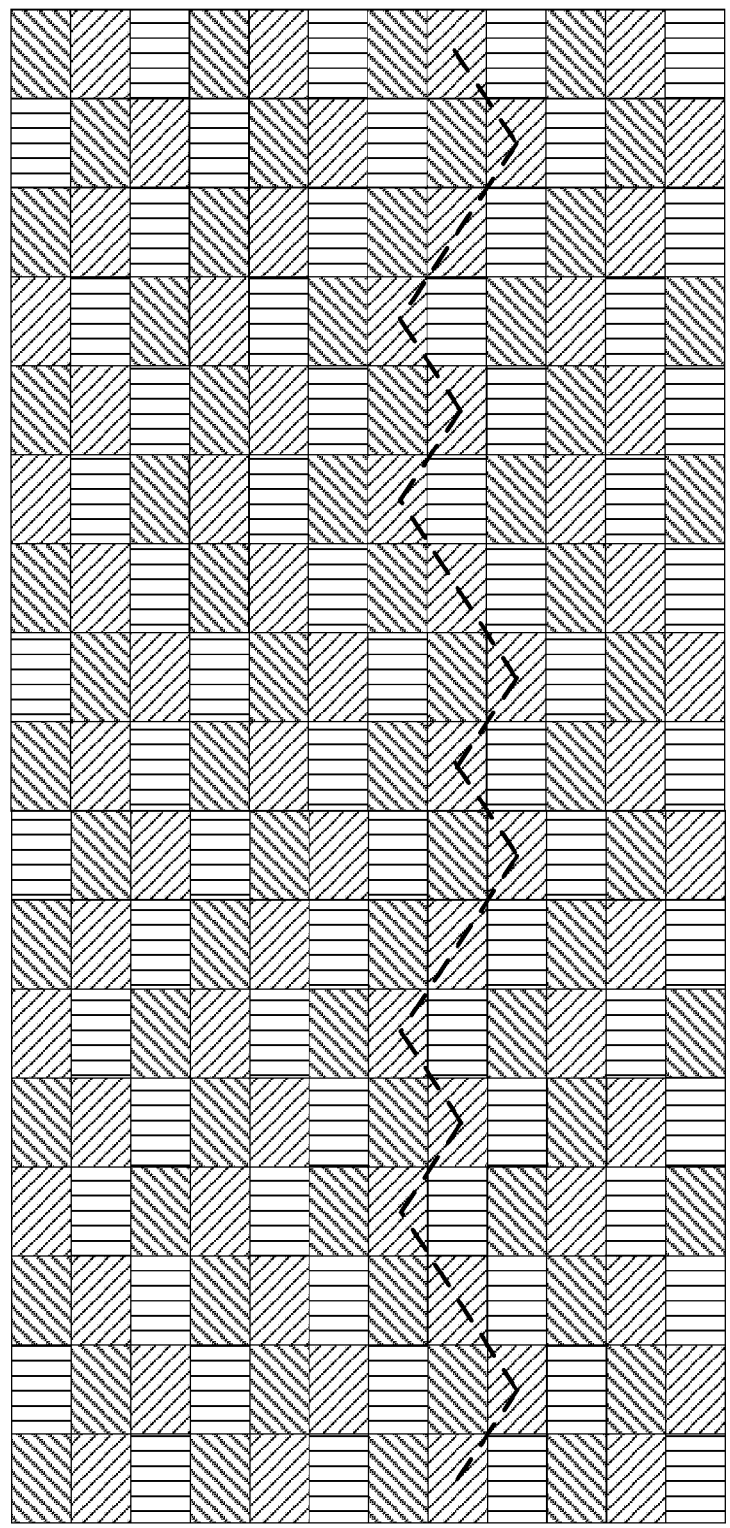
Figure 4C:
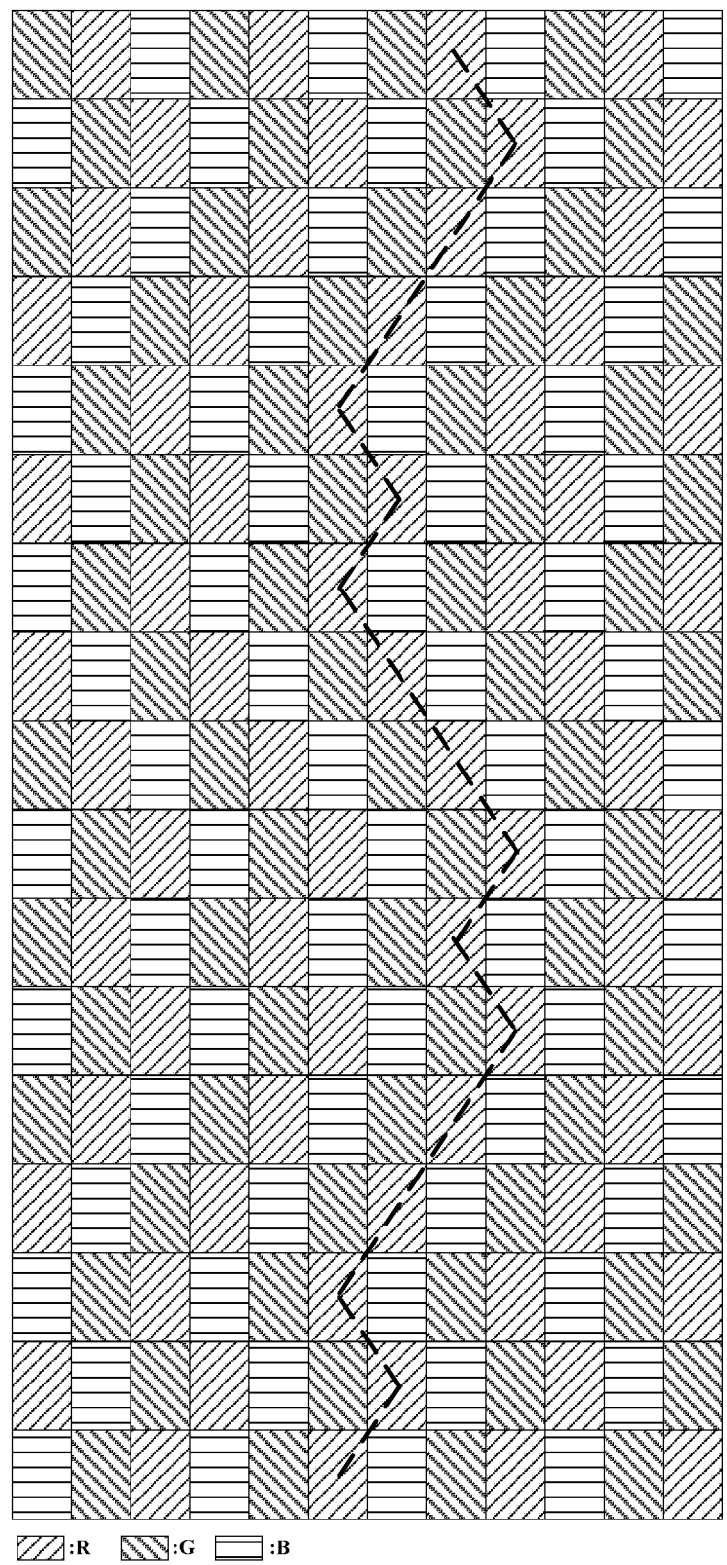
Figure 4D:
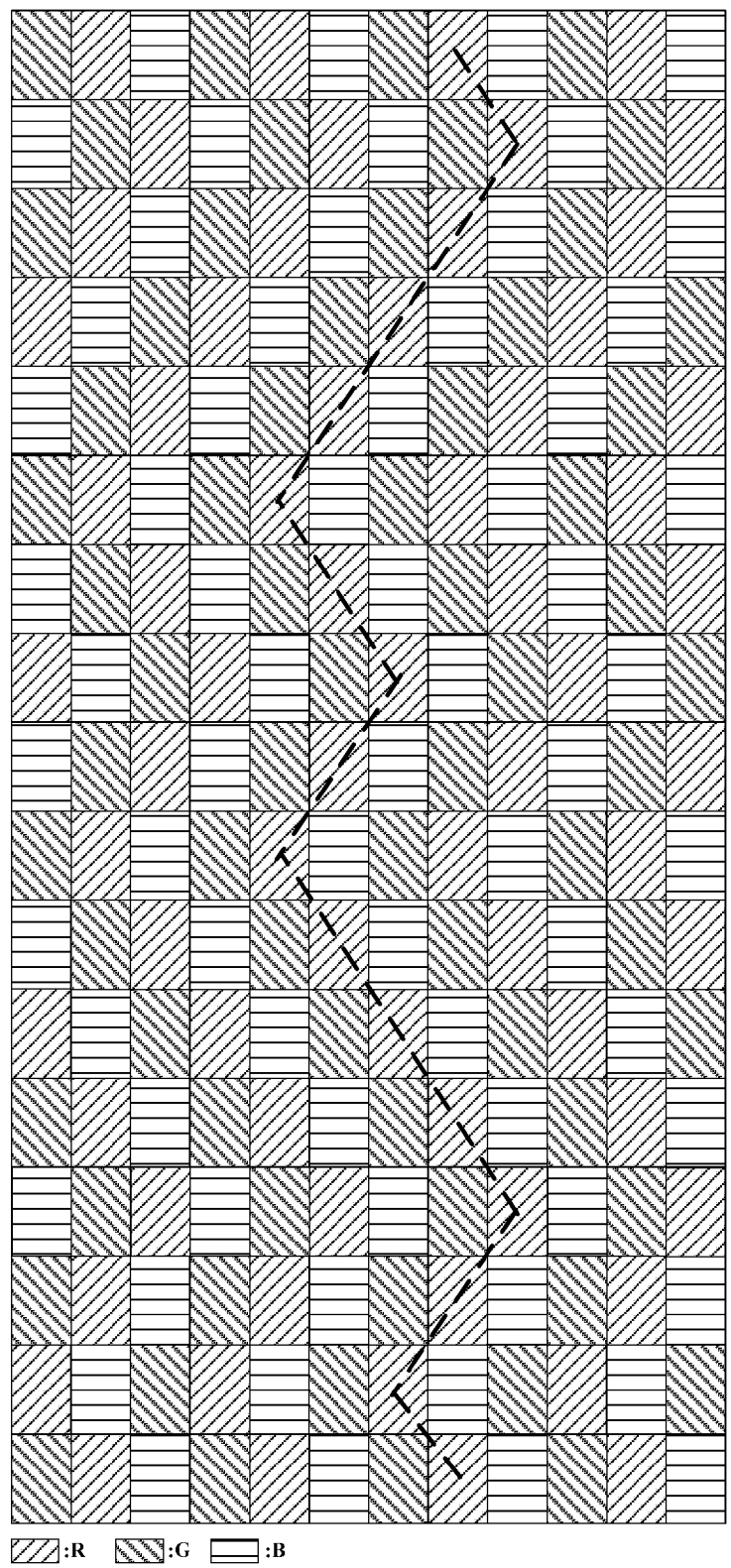
Figure 6:
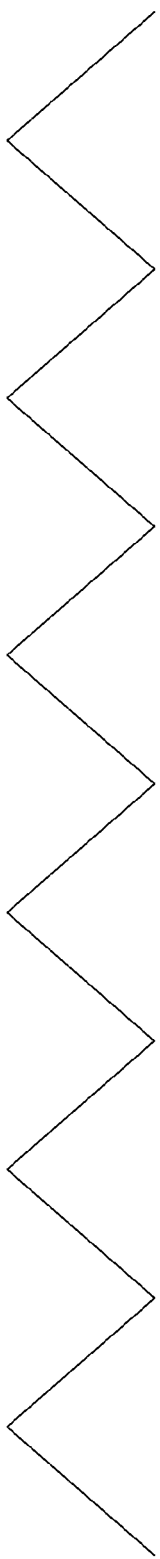
FIG. 6 is a schematic diagram of zigzag diagonal stripes.

In the embodiment shown in FIG. 4A, n equals to 2, a equals to 3 and b equals to 2. However, in other exemplary embodiments of the present disclosure, n, a and b may also be other natural numbers. For example, a can equal to 2 and b can equal to 1 (as illustrated in FIG. 4B); a can equal to 3 and b can equal to 1 (as illustrated in FIG. 4C); a can equal to 4 and b can equal to 2 (as illustrated in FIG. 4D); or the like. In order to avoid zigzag diagonal stripes as illustrated in FIG. 6 from occurring while displaying an image, in this embodiment, a is not equal to b. In addition, in order to control a width of the above zigzag diagonal stripes in the row direction within a certain range, in this embodiment, a is greater than b. However, those skilled in the art would appreciate that a and b that match other rules also belong to the protection scope of the present disclosure. In addition, in this embodiment, all the sub pixel columns are in said zigzag lines. However, in other exemplary embodiments of the present disclosure, some of the sub pixel columns are in the above zigzag lines, and some of the sub pixel columns may not be in the above zigzag lines; or, some of the sub pixel columns may be in one type of the above zigzag lines, and some of the sub pixel columns are in another type of the above zigzag lines, which is not limited to the this embodiment.

In order to achieve a hybrid color display, the above plurality of colors may include a first color, a second color and a third color. In the this embodiment, as an example for description, the first color is red, the second color is green and the third color is blue. However, those skilled in the art would easily appreciate that in other exemplary embodiments of the present disclosure, the first to third colors may also be other color combinations, which is not limited to those in the present exemplary embodiment. Continuing referring to FIG. 4A, in the this embodiment, in the first direction (i.e., the lateral direction), the first color sub pixels, the second color pixels and the third color pixels are sequentially arranged in cycles. Such an arrangement may uniformly distribute brightness of the display unit in the diagonal direction, and improving the rendering effect in the diagonal direction while having a better view angle. In addition, such a sub pixel arrangement may also prevent the generation of lateral stripes due to the uninform brightness between even lines and odd lines.

Figure 7:
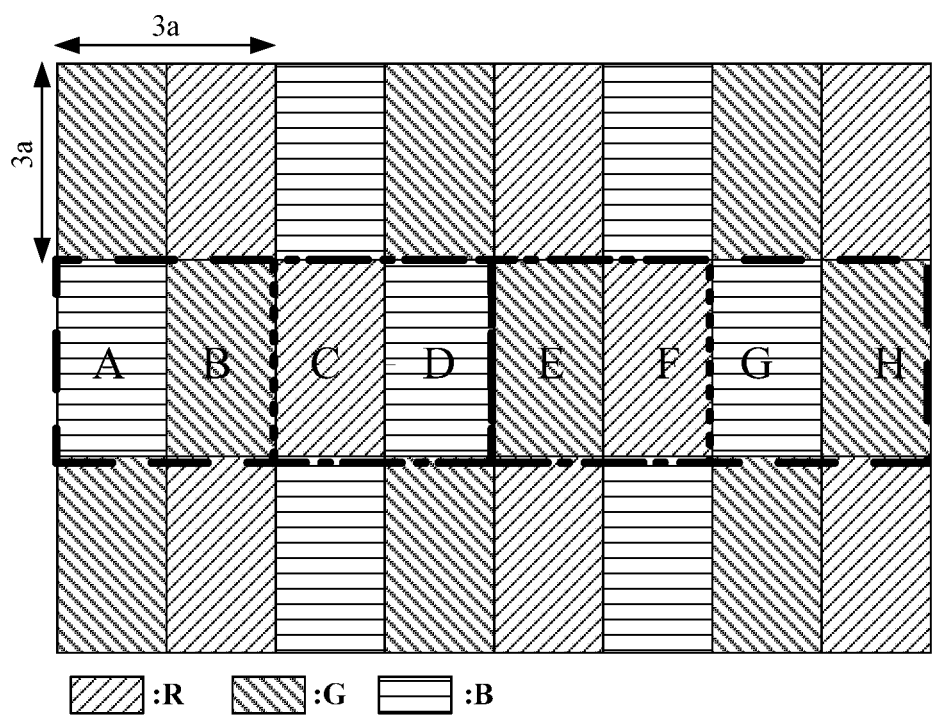
FIG. 7 is a structural schematic diagram of a pixel matrix according to an exemplary embodiment of the present disclosure.

Referring to FIG. 7, in the this embodiment, each of the sub pixels has an aspect ratio of 2:1, such that a total area of all of the sub pixels in the display panel is substantially identical to a standard RGB pixel matrix to facilitate the display with brightness which needs to be provided in the subsequent sub pixel rendering algorithm. Compared with a standard RGB display panel, a width of the sub pixels is increased by ½, a number of sub pixels may be greatly reduced and correspondingly reducing wirings such as data lines, and an aperture ratio of the display device may be efficiently increased while reducing the cost and lowering process difficulty, thereby providing a better display effect. Of course, those skilled in the art may adjust the aspect ratio of each sub pixel according to requirements, such as 3:2, and no particular limitation on this is made by the present exemplary embodiment.

Continuing referring to FIG. 7, in the present exemplary embodiment, one pixel (also referred to as a physical pixel) is composed of two adjacent sub pixels in the same row along the first direction. For example, in the second line in FIG. 7, sub pixels B and C constitute one pixel, sub pixels D and E constitute one pixel, and sub pixels F and G constitute one pixel. Display of the pixel is achieved by a corresponding display unit (also referred to as a display pixel). The display unit is collectively composed of a corresponding pixel and two adjacent sub pixels in the same row with the corresponding pixel, and two display units adjacent in the first direction share the two adjacent sub pixels. In FIG. 7, for example, four sub pixels A, B, C and D collectively form a first display unit, four sub pixels C, D, E and F collectively form a second display unit, and four sub pixels E, F, G and H collectively form a third display unit. The first display unit and the second display unit share sub pixels C and D, and the second display unit and the third display unit share sub pixels E and F.

Figure 8:
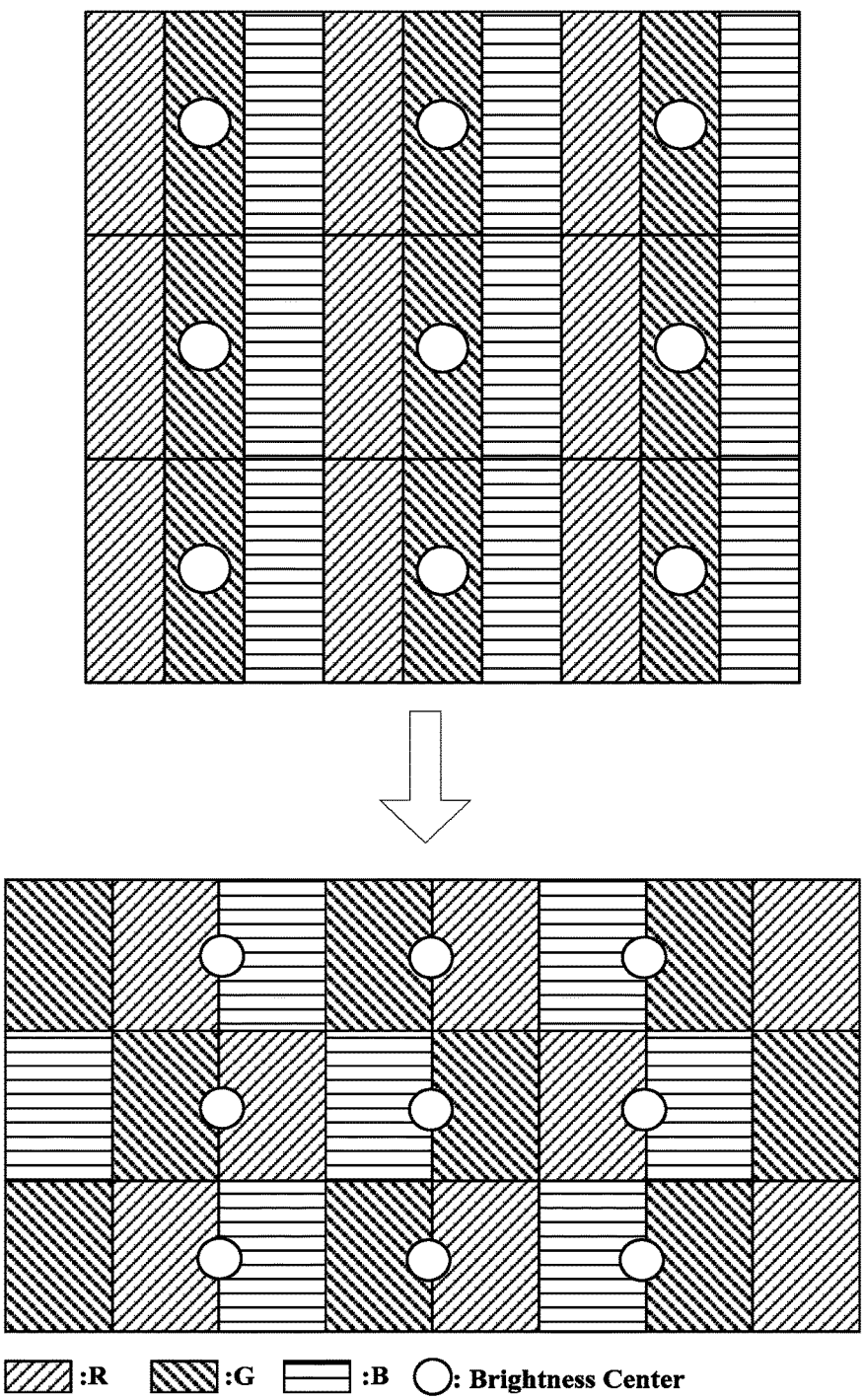
FIG. 8 is a schematic diagram of brightness centers of a standard RGB pixel matrix in the prior art and a pixel matrix according to an exemplary embodiment of the present disclosure.

In the display method according to this embodiment, each display unit has a brightness center. The brightness center is a bright center in the display unit, and human eyes have the strongest sensation to the brightness center. It can be used to visually distinguish display units, and the resolution of the display panel is usually defined by calculating numbers of the brightness centers. As illustrated in FIG. 8, the number of brightness centers in the present exemplary embodiment is not reduced in comparison with a standard RGB display panel in the prior art, accordingly, with the same size, it may visually include display units having substantially the same number with a standard RGB display panel, i.e., visually having substantially the same PPI (pixels per inch) with a standard RGB display panel.

Furthermore, this embodiment further provides a display device including the above display panel as well as other components in the prior art such as a gate driver, a source driver, and the like. Display brightness of each sub pixel in the above display panel may be determined by sub pixel rendering (SPR) algorithms. In the present exemplary embodiment, the display device may further include a sub pixel rendering module capable of converting a brightness value of each virtual sub pixel in a virtual pixel array corresponding to an image to be displayed into a brightness value of each sub pixel in the pixel panel according to a sub pixel rendering algorithm.

Figure 9:
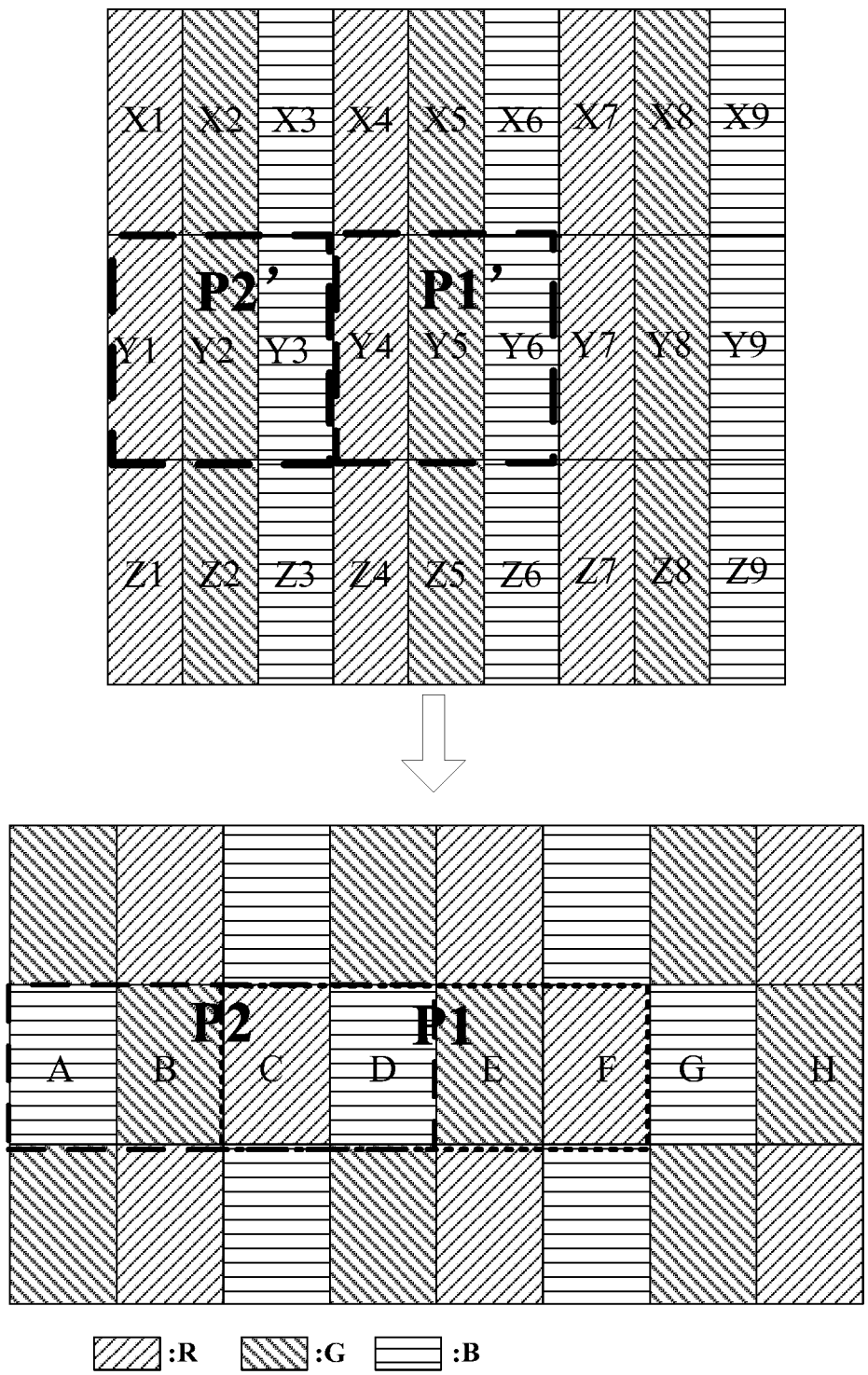
FIG. 9 is a schematic diagram of a sub pixel rendering process according to an exemplary embodiment of the present disclosure.

Referring to FIG. 9, in this embodiment, the virtual pixel array may include virtual display units (the upper portion of FIG. 9) distributed in array and formed by red virtual sub pixels, green virtual sub pixels and blue virtual sub pixels, i.e., a standard RGB pixel matrix corresponding to the data information of the image to be displayed. In the pixel matrix (the lower portion of FIG. 9) provided in the this embodiment, the display units in the display panel are in one to one correspondence with the virtual display units in the virtual pixel array. Continuing referring to FIG. 9, where each sub pixel is shared by two display unit. That is, each sub pixel contributes to the brightness of the virtual sub pixels in the virtual display units, which respectively correspond to the two display units sharing the sub pixel, having the same color as the virtual sub pixel. Based on this, brightness value of each sub pixel may be obtained by summation. For example, in any one of the display unit, brightness value of one sub pixel is L:

$$L=p(x_0 l_0 + x_1 l_1),$$

where, $l_0 \sim l_1$ and $x_0 \sim x_1$ respectively are brightness values of the virtual sub pixels in the virtual display units, which respectively correspond to the two display units sharing the virtual sub pixels having the same color as the sub pixels, and brightness ratios contributed by the virtual sub pixels, and p is an adjustment coefficient and $p \leq 1$.

Continuing referring to FIG. 9, there are four sub pixels including three colors in one display unit, and thus there may be two sub pixels of one color. Accordingly, in the virtual display unit, brightness of some one of the virtual sub pixels is provided by a single sub pixel, and brightness of some one of the virtual sub pixels is collectively provided by two sub pixels. Based on the above, in the present exemplary embodiment, if the whole brightness of the virtual sub pixel in the virtual display unit having the same color as the sub pixel is provided by the sub pixel, a brightness ratio is 1; otherwise, the brightness ratio is 1/2.

Taking display unit P1 constituted of C, D, E and F as an example, its corresponding virtual display unit P1' is constituted of virtual sub pixels Y4, Y5 and Y6. Here, red sub pixel C is shared by the display unit P1 and the display unit P2 (A, B, C and D) to the left of the display unit P1. Display units P1 and P2 respectively correspond to the virtual display unit P1' and the virtual display unit P2' to the left of the virtual display unit P1'. That is, the red sub pixel C needs to provide a part or whole of the brightness of the red virtual sub pixels Y1 and Y4 in the virtual pixel unit. For example, in the virtual pixel unit P1', brightness of virtual sub pixel Y4 is collectively provided by the red sub pixel C and red sub pixel F, and thus corresponding brightness ratio is 1/2; and in the virtual pixel unit P2', brightness of virtual sub pixel Y1 is independently provided by the red sub pixel C, and thus corresponding brightness ratio is 1. Accordingly, a brightness value C of the red sub pixel C is:

$$C=p(\frac{1}{2}\cdot Y4+Y1).$$

Blue sub pixel D in the pixel matrix is shared by the blue virtual sub pixels Y3 and Y6 of the virtual pixel matrix, and similarly, its brightness value D may be:

$$D=p(\frac{1}{2}\cdot Y3+Y6).$$

Green sub pixel E in the pixel matrix is shared by the green virtual sub pixels Y5 and Y8 of the virtual pixel matrix, and similarly, its brightness value E may be:

$$E=p(\frac{1}{2}\cdot Y8+Y5).$$

Red sub pixel F in the pixel matrix is shared by the red virtual sub pixels Y4 and Y7 of the virtual pixel matrix, and similarly, its brightness value F may be:

$$F=p(\frac{1}{2}\cdot Y4+Y7).$$

The adjustment coefficient p is mainly used to attenuate the calculated brightness value to avoid overflow of the brightness. Meanwhile, the adjustment coefficient p may also be used to adjust the brightness and the contrast ratio of the displayed image.

Brightness of each sub pixel in other pixel units in the pixel matrix may be calculated and obtained by the above means, and display may be performed by providing corresponding data signals via a source driver, data lines and the like based on the above calculation. Those skilled in the art would appreciate that the above ratios and coefficients involved in the above calculation may also be other values, and are not limited to the present exemplary embodiment.

Furthermore, this embodiment further provides a display method corresponding to the above display device. Since the detailed implementation of the method has been described in detail in the exemplary embodiments regarding the above display device, repeated description will be omitted here.

In the display device and display method according to this embodiment, because a new sub pixel columns arrangement and structure are provided, diagonal stripes are prevented from occurring in the displayed image. In addition, due to being combined with corresponding sub pixel rendering algorithms, a PPI substantially the same with a standard RGB display panel may be visually realized. Meanwhile, compared with a known standard RGB pixel matrix, a number of sub pixels may be greatly reduced and correspondingly wirings such as data lines may be reduced, and an aperture ratio of the display device may be efficiently increased while reducing the cost and lowering process difficulty, thereby providing a better display effect.

The present disclosure has been described by the above relating embodiments; however, the above embodiments are merely examples of the present disclosure. It should note that, the disclosed embodiments do not limit the scope of the present disclosure. Instead, all the changes and modifications without departing the spirit and scope of the present disclosure belong to the patent protection scope of the present disclosure.

What is claimed is:

1. A display device, comprising:
a display panel including a sub pixel array formed by arrangement of sub pixels of various colors, the sub pixel array comprising a plurality of sub pixel columns arranged sequentially in a first direction, each of the sub pixel columns being formed by a plurality of sub pixels of a same color arranged sequentially, where:
at least one of the sub pixel columns is in a zigzag line, and the zigzag line is formed by repeat units that repeat in a second direction, where each of the repeat units comprises six segments from a first segment to a sixth segment that are connected successively, where:
the first segment to the sixth segment are respectively formed by connecting center points of a pixel column from n-th sub pixel to the (n+a)-th sub pixel, a pixel column from the (n+a)-th sub pixel to the (n+a+b)-th pixel sub pixel, a pixel column from the (n+a+b)-th pixel sub pixel to the (n+a+2b)-th pixel sub pixel, a pixel column from the (n+a+2b)-th pixel sub pixel to the (n+2a+2b)-th pixel sub pixel, a pixel column from the (n+2a+2b)-th pixel sub pixel to the (n+2a+3b)-th pixel sub pixel, and a pixel column from the (n+2a+3b)-th pixel sub pixel to the (n+2a+4b)-th pixel sub pixel,
the first, third and fifth segments are parallel to a diagonal direction of a sub pixels, and the second, fourth and sixth segments are parallel to the other diagonal direction of the sub pixels,
where the first direction is vertical to the second direction, and n, a and b are natural numbers,
wherein two adjacent ones of the sub pixels in the same row along the first direction constitute a pixel, and
wherein the display of the pixel is performed by a corresponding display unit, which is formed by a corresponding pixel and two adjacent ones of the sub pixels in the same row along the first direction, and two adjacent ones of the display units along the first direction share the two adjacent ones of the sub pixels; and
a sub pixel rendering circuit, configured to convert a brightness value of each of virtual sub pixels in a virtual pixel array corresponding to an image to be displayed into a brightness value of each of the sub pixels in the display panel, according to a sub pixel rendering algorithm,
wherein a display unit is formed by four adjacent sub pixels in the same row along the first direction, and the two adjacent display units along the first direction share two of the sub pixels,
wherein the virtual pixel array comprises virtual display units distributed in a shape of an array and formed by first to third color virtual sub pixels, the display units in the display panel are in one to one correspondence with the virtual display units in the virtual pixel array, and the sub pixel rendering algorithm comprises: converting brightness values of the virtual sub pixels in each of the virtual display units into brightness values of the sub pixels in the display units, and
wherein the converting brightness values of the virtual sub pixels in each of the virtual display units into brightness values of the sub pixels in the display units comprises:
in any one of the display units, the brightness value of one sub pixel is L:

$$L=p(x_0 l_0 + x_1 l_1),$$

where $l_0 \sim l_1$ respectively are brightness values of the virtual sub pixels in the virtual display units, which respectively correspond to the two display units sharing the sub pixels, the virtual sub pixels having the same color as the shared sub pixels, $x_0 \sim x_1$ respectively are brightness ratios contributed by the virtual sub pixels, and p is an adjustment coefficient and $p \leq 1$.

2. The display device according to claim 1, where if the whole brightness of the virtual sub pixel in the virtual display unit having the same color as the sub pixel is provided by the sub pixel, a brightness ratio is 1; otherwise, the brightness ratio is 1/2.

3. A display method applied in a display panel comprising a sub pixel array formed by arrangement of by sub pixels of various colors, the sub pixel array including a plurality of sub pixel columns arranged sequentially in a first direction, and each of the sub pixel columns being formed by a plurality of sub pixels of a same color arranged sequentially, where:

at least one of the sub pixel columns is in a zigzag line, and the zigzag line is formed by repeat units that repeat in a second direction, where each of the repeat units includes six segments from a first segment to a sixth segment that are connected successively, where:

the first segment to the sixth segment are respectively formed by connecting center points of a pixel column from n-th sub pixel to the (n+a)-th sub pixel, a pixel column from the (n+a)-th sub pixel to the (n+a+b)-th pixel sub pixel, a pixel column from the (n+a+b)-th pixel sub pixel to the (n+a+2b)-th pixel sub pixel, a pixel column from the (n+a+2b)-th pixel sub pixel to the (n+2a+2b)-th pixel sub pixel, a pixel column from the (n+2a+2b)-th pixel sub pixel to the (n+2a+3b)-th pixel sub pixel, and a pixel column from the (n+2a+3b)-th pixel sub pixel to the (n+2a+4b)-th pixel sub pixel, the first, third and fifth segments are parallel to a diagonal direction of a sub pixel, and the second, fourth and sixth segments are parallel to the other diagonal direction of the sub pixel, and where the first direction is vertical to the second direction, and n, a and b are natural numbers, and the display method comprising:

converting a brightness value of each virtual sub pixels in a virtual pixel array corresponding to an image to be displayed into a brightness value of each of the sub pixels in the display panel, according to a sub pixel rendering algorithm, wherein a display unit is formed by four adjacent sub pixels in the same row along the first direction, and the two adjacent display units along the first direction share two of the sub pixels, wherein the virtual pixel array comprises virtual display units distributed in a shape of an array and formed by first to third color virtual sub pixels, the display units in the display panel are in one to one correspondence with the virtual display units in the virtual pixel array, and the sub pixel rendering algorithm comprises: converting brightness values of the virtual sub pixels in each of the virtual display units into brightness values of the sub pixels in the display units, and wherein the converting brightness values of the virtual sub pixels in each of the virtual display units into brightness values of the sub pixels in the display units comprises:

in any one of the display units, brightness value of one sub pixel is L:

$$L=p(x_0 l_0 + x_1 l_1)$$

where $l_0 \sim l_1$ are brightness values of the virtual sub pixels in the virtual display units, which respectively correspond to the two display units sharing the sub pixels, having the same color as the sub pixels, $x_0 \sim x_1$ are brightness ratios contributed by the sub pixels, and p is an adjustment coefficient and $p \leq 1$.

4. The display method according to claim 3, where if the whole brightness of the virtual sub pixel in the virtual display unit having the same color as the sub pixel is provided by the sub pixel, a brightness ratio is 1; otherwise, the brightness ratio is 1/2.

* * * * *